United States Patent
Campardo et al.

(10) Patent No.: US 9,865,356 B2
(45) Date of Patent: Jan. 9, 2018

(54) CIRCUIT AND METHOD FOR READING A MEMORY CELL OF A NON-VOLATILE MEMORY DEVICE

(71) Applicant: STMicroelectronics S.r.l, Agrate Brianza (IT)

(72) Inventors: Giovanni Campardo, Bergamo (IT); Salvatore Polizzi, Palermo (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 15/275,362

(22) Filed: Sep. 24, 2016

(65) Prior Publication Data

US 2017/0263323 A1    Sep. 14, 2017

(30) Foreign Application Priority Data

Mar. 9, 2016    (IT) .......................... 102016000024496

(51) Int. Cl.
    *G11C 11/34*    (2006.01)
    *G11C 16/26*    (2006.01)
    *G11C 16/04*    (2006.01)
    *G11C 16/08*    (2006.01)

(52) U.S. Cl.
    CPC .......... *G11C 16/26* (2013.01); *G11C 16/0408* (2013.01); *G11C 16/08* (2013.01)

(58) Field of Classification Search
    CPC ...... G11C 16/26; G11C 16/0408; G11C 16/08
    USPC .................. 365/185.13, 185.21, 203, 205
    See application file for complete search history.

(56) References Cited

U.S. PATENT DOCUMENTS

| 6,307,797 | B1 | 10/2001 | Fournel et al. |
| 6,310,809 | B1* | 10/2001 | Roohparvar ............. G11C 7/12 365/185.13 |
| 6,359,821 | B1* | 3/2002 | Roohparvar ............. G11C 7/14 365/189.11 |
| 6,496,434 | B1 | 12/2002 | Nobunaga |
| 9,520,177 | B2* | 12/2016 | Matsumoto ......... G11C 11/4094 |
| 2004/0017691 | A1* | 1/2004 | Luk ....................... G11C 7/065 365/149 |
| 2007/0230245 | A1* | 10/2007 | Watanabe ................ G11C 8/12 365/185.09 |
| 2008/0165601 | A1* | 7/2008 | Matick ................ G11C 11/4097 365/202 |
| 2008/0273397 | A1 | 11/2008 | Hendrickson et al. |
| 2008/0291762 | A1* | 11/2008 | Kajigaya ............. G11C 11/4076 365/203 |

(Continued)

*Primary Examiner* — Viet Q Nguyen
(74) *Attorney, Agent, or Firm* — Slater Matsil, LLP

(57) ABSTRACT

A circuit for reading a memory cell of a non-volatile memory device provided with a memory array with cells arranged in wordlines and bitlines, among which a first bitline, associated to the memory cell, and a second bitline, has: a first circuit branch associated to the first bitline and a second circuit branch associated to the second bitline, each with a local node, coupled to which is a first dividing capacitor, and a global node, coupled to which is a second dividing capacitor; a decoder stage for coupling the local node to the first or second bitlines and coupling the global node to the local node; and a differential comparator stage supplies an output signal indicative of the datum stored; and a control unit for controlling the decoder stage, the coupling stage, and the differential comparator stage for generation of the output signal.

18 Claims, 7 Drawing Sheets

(56) References Cited

U.S. PATENT DOCUMENTS

| | | | |
|---|---|---|---|
| 2009/0231939 A1* | 9/2009 | Hsu | G11C 7/08 365/210.12 |
| 2009/0303793 A1* | 12/2009 | Morton | G11C 16/0483 365/185.13 |
| 2010/0054016 A1* | 3/2010 | Kajigaya | G11C 7/067 365/148 |
| 2010/0054065 A1* | 3/2010 | Kajigaya | G11C 7/067 365/205 |
| 2011/0026292 A1* | 2/2011 | Narui | G11C 5/025 365/63 |
| 2011/0116296 A1* | 5/2011 | Kitagawa | G11C 11/5678 365/51 |
| 2012/0147686 A1* | 6/2012 | Takayama | G11C 7/12 365/203 |
| 2012/0287740 A1* | 11/2012 | Vimercati | H03F 3/45762 365/203 |
| 2013/0155798 A1* | 6/2013 | Kajigaya | G11C 7/065 365/208 |
| 2013/0194857 A1* | 8/2013 | Miyamoto | G11C 11/4063 365/149 |
| 2013/0215698 A1* | 8/2013 | Nagata | G11C 7/12 365/203 |
| 2014/0328134 A1* | 11/2014 | Vimercati | H03F 3/45762 365/203 |
| 2015/0318025 A1 | 11/2015 | Park | |
| 2016/0064044 A1* | 3/2016 | Stansfield | G11C 7/12 365/189.15 |
| 2016/0180948 A1* | 6/2016 | Tanabe | G11C 16/0475 365/185.21 |

* cited by examiner

US 9,865,356 B2

CIRCUIT AND METHOD FOR READING A MEMORY CELL OF A NON-VOLATILE MEMORY DEVICE

CROSS-REFERENCE TO RELATED APPLICATIONS

This application claims priority to Italian Application No. 102016000024496, filed on Mar. 9, 2016, which application is hereby incorporated herein by reference.

TECHNICAL FIELD

The present invention relates to a circuit and a method for reading a memory cell of a non-volatile memory device, for example of a floating-gate flash type. As will be described in detail hereinafter, the reading circuit and method do not envisage the use of reference circuit elements or structures for reading the datum stored in the memory cell.

BACKGROUND

In a known way, and as illustrated schematically in FIG. 1, a non-volatile memory device, designated by 1, for example of a flash type, generally comprises a memory array 2 made up of a plurality of memory cells 3, arranged in rows (usually defined as wordlines, WL), and columns (usually defined as bitlines, BL).

Each memory cell 3 is constituted by a storage element, for example formed by a floating-gate transistor in flash memories, with gate terminal designed to be coupled to a respective wordline WL, a first conduction terminal designed to be coupled to a respective bitline BL and a second conduction terminal connected to a reference potential (for example ground, gnd). In particular, the gate terminals of the memory cells 3 of a same wordline WL are connected together.

A reading circuit 4 (represented schematically in FIG. 1) enables selection, on the basis of address signals received at the input (generated in a known manner and designated in general by AS), of the memory cells 3, and in particular of the corresponding wordlines WL and bitlines BL each time addressed, enabling biasing thereof at appropriate voltage and current values during the operations of reading of the data stored.

The reading circuit 4 provides in particular a reading path, which is designed to create a conductive path between the bitlines BL of the memory array 2 each time selected and a sense-amplifier stage, of a differential type, designed to compare the current circulating in the addressed (i.e., activated) memory cell 3, which receives an appropriate biasing voltage on the respective gate terminal, with a reference current, in order to determine the value of the datum stored and consequently generate a digital reading signal, indicative of the datum stored.

A reading circuit 4, of a known type, thus envisages in general, as illustrated schematically in FIG. 2, a sense-amplifier stage, designated by 6, having: a first differential input 6a, coupled to a memory cell 3 (to the gate terminal of which an appropriate row-biasing voltage $V_{WL}$ is supplied), from which it receives a cell reading current $I_{cell}$, the value of which is a function of the datum stored; a second differential input 6b, coupled to a reference circuit element 8, from which it receives a reference current $I_{ref}$; and an output 6c that supplies a digital output signal $S_{out}$, the value of which is a function of the comparison between the cell reading current $I_{cell}$ and the reference current $I_{ref}$, and is indicative of the value of the datum stored in the memory cell 3, activated for reading the same datum.

In known solutions, the aforesaid reference circuit element 8 may for example be: a reference cell 8a, which is structurally the same as the memory cell 3 that is to be read and has electrical characteristics controlled and known beforehand (for supplying a known value of the reference current $I_{ref}$); or else a reference-current generator 8b, designed to generate the same reference current $I_{ref}$ of a desired value.

The reading operation of the datum stored in the memory cell 3 thus envisages detection of the cell reading current $I_{cell}$ and its comparison with the reference current $I_{ref}$, in order to generate, via the sense-amplifier stage 6, the digital output signal $S_{out}$. For instance, in the case where the cell reading current $I_{cell}$ is higher than the reference current $I_{ref}$, the digital output signal $S_{out}$ may have a high logic value, '1'; whereas the digital output signal $S_{out}$ may have a low logic value, '0', in the opposite case, where, that is, the cell reading current $I_{cell}$ is lower than the reference current $I_{ref}$.

The present Applicant has realized that the solutions of a known type for carrying out reading of the data stored in the memory cells of non-volatile memory devices may not be compatible with the requirements of size reduction (the so-called "scaling down") of memory cells, and of simultaneous increase in electrical performance (in particular, in terms of increase in reading speed, or likewise of reduction of the access time and consumption), envisaged by technological progress.

SUMMARY

Embodiments of the present invention provide a solution for reading a memory cell of a non-volatile memory device, with improved electrical performance and reduced area occupation.

According to the present invention, a circuit for reading a memory cell of a non-volatile memory device and a corresponding reading method are provided, as defined in the annexed claims.

BRIEF DESCRIPTION OF THE DRAWINGS

For a better understanding of the present invention, preferred embodiments thereof are now described purely by way of non-limiting example, with reference to the attached drawings, wherein.

DETAILED DESCRIPTION OF ILLUSTRATIVE EMBODIMENTS

A particular aspect of the present solution envisages, as will be described in detail, first with reference to FIG. 3, elimination, for the reading operations, of a reference circuit element (whether this is a reference memory cell, or a reference-current generator, or any other element purposely provided for generating a reference electrical quantity or comparison electrical quantity). For this purpose, the present solution envisages execution of an operation of comparison between electrical quantities associated to two bitlines of the memory array 2, and in particular the bitline BL to which the memory cell 3 belongs, activated for reading of the datum stored, and a different bitline BL', for example the (physically or logically) adjacent bitline in the same memory array 2.

Figure 1:
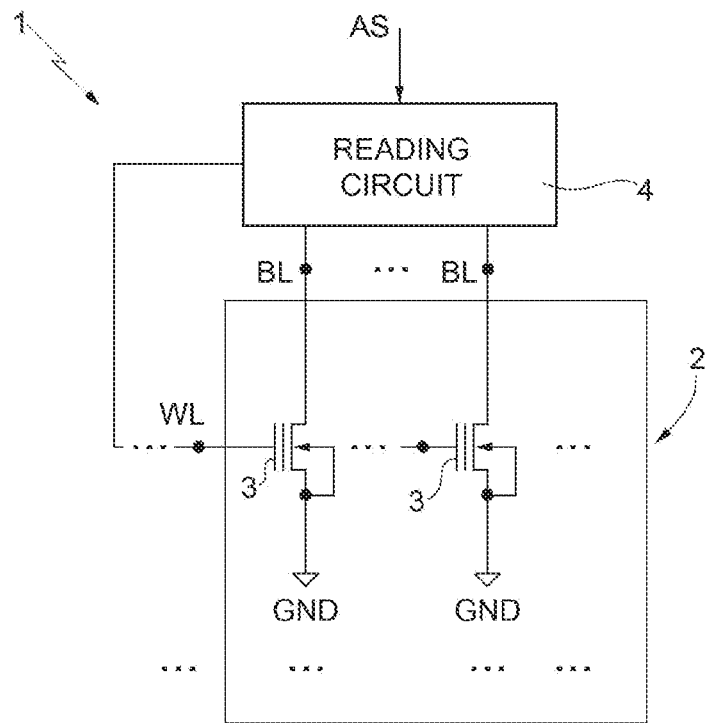
FIG. 1 shows a general block diagram of a non-volatile memory device, of a known type.
Figure 2:
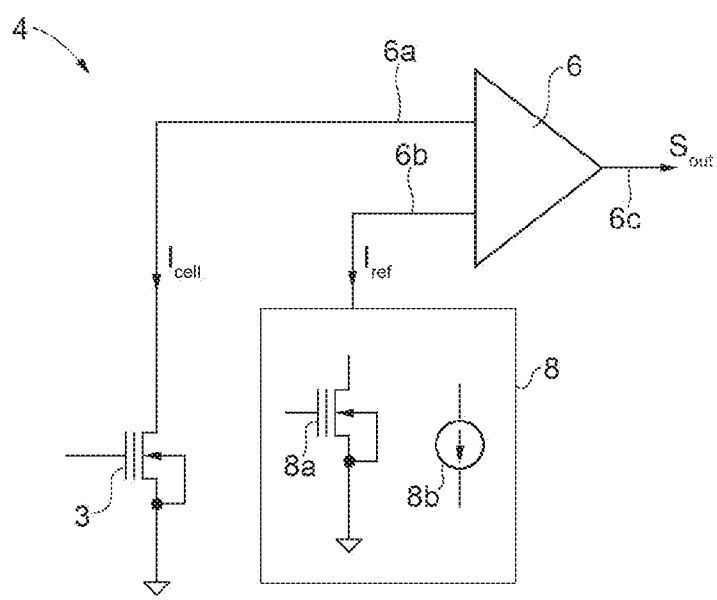
FIG. 2 shows a general block diagram of a reading circuit in the non-volatile memory device of FIG. 1, which is also of a known type.
Figure 3:
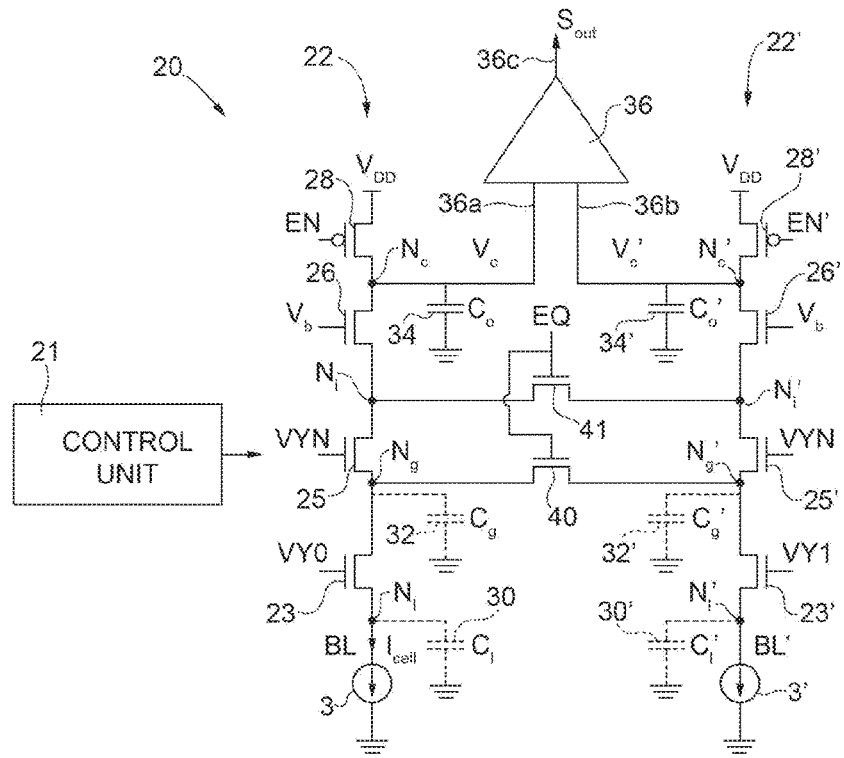
FIG. 3 shows a circuit for reading a memory cell, according to an embodiment of the present invention.

With reference to FIG. 3, an embodiment of a reading circuit, designated by 20, is now described, which implements a hierarchical column decoding with two decoding levels, local and global, in a non-volatile memory device (for example, the non-volatile memory device 1 of FIG. 1, of a flash type with floating-gate memory cells).

The reading circuit 20 (of which only the elements required for the description of the present solution are shown) comprises a control unit 21 (represented schematically), and moreover a circuit branch 22, 22' for each of the bitlines of the memory array 2. In FIG. 3, as in the subsequent figures, reference is made only to two adjacent bitlines BL and BL' of the memory array 2.

In what follows, for simplicity of exposition, only the circuit branch 22 will be described, altogether similar considerations evidently applying also to the circuit branch 22' (as on the other hand is evident from an examination of the aforesaid FIG. 3).

In detail, the circuit branch 22 comprises a number of elements. At least one local decoding transistor 23, in the example of an NMOS type, has a first conduction terminal connected to a local node $N_l$, which is coupled to a local bitline $BL_l$, and which is in turn physically connected to the bitline BL and to the memory cell 3 activated for reading (here represented schematically as a generator of the cell reading current $I_{cell}$). A second conduction terminal is connected to a global node $N_g$, coupled to a global bitline $BL_g$ (also referred to as "main bitline"), which represents a level of decoding hierarchically higher than the local bitline $BL_l$. A control terminal of the transistor 23 receives a local decoding signal VY0 from the control unit 21 of the non-volatile memory device 1.

The circuit branch 22 also comprises at least one global decoding transistor 25, in the example of an NMOS type, having a first conduction terminal connected to the global node $N_g$, a second conduction terminal connected to an internal node $N_i$, and a control terminal receiving a global decoding signal VYN from the control unit 21. The circuit branch 22 also comprises at least one protection transistor 26, in the example of an NMOS type, having a first conduction terminal connected to the internal node $N_i$, a second conduction terminal connected to a comparison node $N_c$, on which a comparison voltage $V_c$ is present, and a control terminal receiving a biasing signal $V_b$.

The circuit branch 22 also comprises an enabling transistor 28, in the example of a PMOS type, having a first conduction terminal connected to the comparison node $N_c$, a second conduction terminal connected to a supply terminal, which receives a supply voltage $V_{DD}$ for supplying the memory device 1, and a control terminal, which receives an enabling signal EN.

In a way that will be evident to a person skilled in the field, the local column decoding, for selection and biasing of the local bitline $BL_l$, could be implemented by further local decoding transistors (here not illustrated), and likewise the global column decoding, for selection and biasing of the global bitline $BL_g$, could be implemented by further global decoding transistors (not illustrated here, either), depending on the size of the memory array 2 and the decoding requirements.

The local decoding transistor 23' of the circuit branch 22' receives on the control terminal a respective local decoding signal, designated by VY1, whereas the global decoding transistor 25' receives the same global decoding signal VYN of the global decoding transistor 25 (typically, a number of local bitlines, for example four, may in fact be selectively coupled to a same global bitline, which consequently selects and biases a "sector" of the memory array 2 constituted by the memory cells 3 connected to these local bitlines).

The protection transistor 26' of the circuit branch 22' receives the same biasing signal $V_b$ as the protection transistor 26, whereas the enabling transistor 28' receives a respective enabling signal EN'. In particular, the aforesaid protection transistors 26, 26' have a cascode function; i.e., the value of the biasing voltage $V_b$ is such as to set a maximum value allowed for the voltages of the underlying internal nodes $N_i$, $N_i'$, preventing any possible stresses and damage during reading.

Furthermore, the enabling transistors 28, 28' have the function of enabling pre-charging of the nodes of the circuit branches 22, 22' and of the parasitic capacitances associated to the corresponding bitlines BL, BL'.

Referring to FIG. 3, a first parasitic capacitor 30 (represented with a dashed line) is coupled between the local node $N_l$, associated to the local bitline $BL_l$, and the ground reference gnd of the reading circuit 20. A second parasitic capacitor 32 (which is also represented with a dashed line) is coupled between the global node $N_g$, associated to the global bitline $BL_g$, and the same ground reference gnd.

In general, as will on the other hand be evident to a person skilled in the field, the capacitance $C_g$ of the second parasitic capacitor 32, i.e., the parasitic capacitance associated to the global bitline $BL_g$, is much greater (for example, at least by one order of magnitude) than the capacitance $C_l$ of the first parasitic capacitor 30, i.e., the parasitic capacitance associated to the local bitline $BL_l$.

The values of the capacitances $C_l$ and $C_g$ associated to the circuit branch 22 are further substantially equal to the values of the corresponding capacitances $C_l'$ and $C_g'$ associated to the circuit branch 22'.

Incidentally, it is pointed out that the ratios of the resistances associated to the global bitline $BL_g$ and the local bitline $BL_l$ are instead typically opposite, the local bitline $BL_l$ being in fact normally more resistive than the global bitline $BL_g$.

The circuit branch 22 further comprises a further output capacitor 34, which may be parasitic or be physically present in the circuit, between the comparison node $N_c$ and the ground reference gnd.

The value of capacitance $C_o$ of this output capacitor 34 is much lower than the capacitance $C_g$ associated to the global bitline $BL_g$ of the same circuit branch 22; furthermore, the value of capacitance $C_o$ of the output capacitor 34 of the circuit branch 22 is substantially equal to the value of capacitance $C_o'$ of the output capacitor 34' of the circuit branch 22'.

The reading circuit 20 further comprises a sense-amplifier stage 36, of a differential type, having a first input 36a and a second input 36b, connected, respectively, to the comparison node $N_c$ of the circuit branch 22 and to the comparison node $N_c'$ of the circuit branch 22', which consequently receive the respective comparison voltages $V_c$, $V_c'$, and an output 36c supplying a digital output signal, once again designated by $S_{out}$, having a logic value '1' or '0', indicative of the value of the datum stored in the memory cell 3 activated for reading.

According to a particular aspect of the present solution, the reading circuit 20 further comprises a coupling stage formed by a first coupling transistor 40, in the example of an NMOS type, which is connected between the global nodes $N_g$ and $N_g'$ of the circuit branches 22, 22' and has a control terminal receiving an equalization signal EQ; and a second coupling transistor 41, which in the example is also of an NMOS type, is connected between the internal nodes $N_i$, $N_i'$ of the circuit branches 22, 22', and has a respective control terminal receiving the same equalization signal EQ.

As will be discussed in detail hereinafter, the first and second coupling transistors 40, 41 have the function of equalizing the nodes on their terminals, referred to the circuit branches 22, 22' of the adjacent bitlines BL, BL', guaranteeing that the corresponding voltage values are substantially equal, in given operating conditions.

A description of the operation of the reading circuit 20, during reading of the datum stored in the memory cell 3, is now presented; this operation is in general articulated in three distinct operating steps consecutive with respect to one another, managed by the control unit 21, by generation and supply of appropriate biasing signals:

a first operating step, for preparation of the voltages at the nodes, and in particular for pre-charging of the parasitic capacitors 30, 32 of the circuit branch 22;

a second operating step, for equalization of the voltages at the nodes of the circuit branches 22 and 22'; and a third operating step, for unbalancing, on the basis of the value of the datum stored in the memory cell 3, of the voltages on the global nodes $N_g$ and $N_g'$ of the circuit branches 22, 22' and consequently of the comparison voltages $V_c$, $V_c'$ on the comparison nodes $N_c$ and $N_c'$, and of comparison of the same voltages $V_c$, $V_c'$ for generation of the digital output signal $S_{out}$ indicative of the value of the stored datum.

Figure 4:
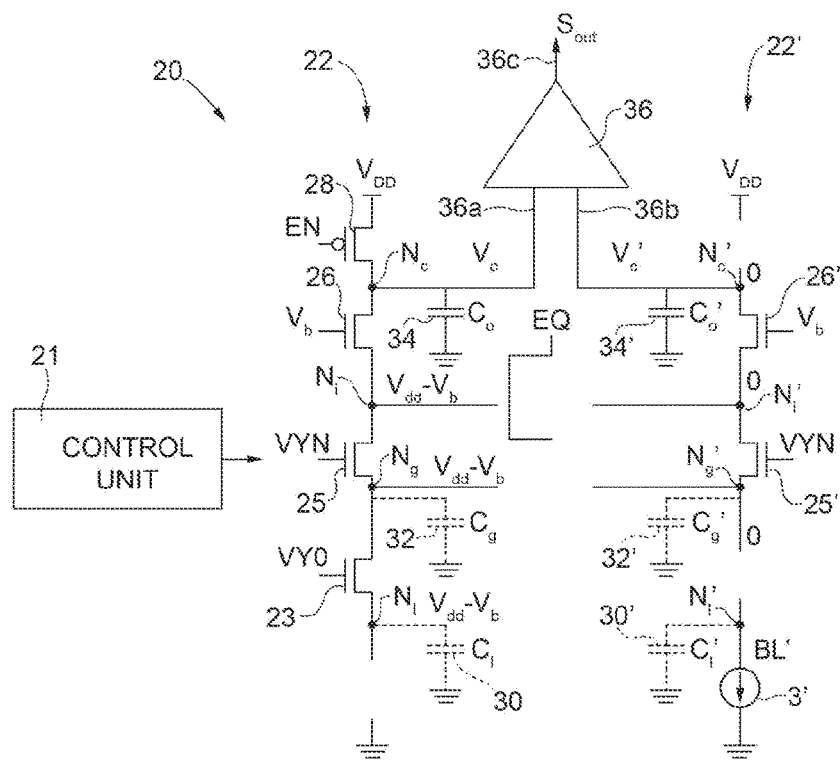
FIGS. 4, 5, 6a-6c, and 7a-7c show the reading circuit of FIG. 3, with voltage values indicated on respective nodes, in given operating conditions, referring to an operation of reading of a datum stored in the memory cell.

In greater detail and with reference to FIG. 4, the first operating step envisages the following conditions:

local decoding signal VY0 high (i.e., local decoding transistor 23 on);

local decoding signal VY1 low (local decoding transistor 23' off; for this reason, local decoding transistor 23' is not represented in FIG. 4);

enabling signal EN low (enabling transistor 28 on);

enabling signal EN' high (enabling transistor 28' off);

equalization signal EQ low (first and second coupling transistors 40, 41 off);

global decoding signal VYN on (global decoding transistors 25, 25' on); and biasing signal $V_b$ high (protection transistors 26, 26' on).

These operating conditions mean that the capacitances of the parasitic capacitors 30, 32 of the local and global bitlines of the circuit branch 22 are pre-charged, in particular at the same value $V_{dd}-V_b$ (as shown in the aforesaid FIG. 4). Instead, the adjacent bitline BL' is at ground, with substantially zero voltage values on the nodes of the circuit branch 22' (in particular, on the global node $N_g'$ and consequently on the internal node $N_i'$ and on the comparison node $N_c'$).

The memory cell 3 is, in this step, still off or deactivated (in a way not illustrated, the corresponding wordline WL has not yet been addressed and/or biased at the value required by the reading operation).

Figure 5:
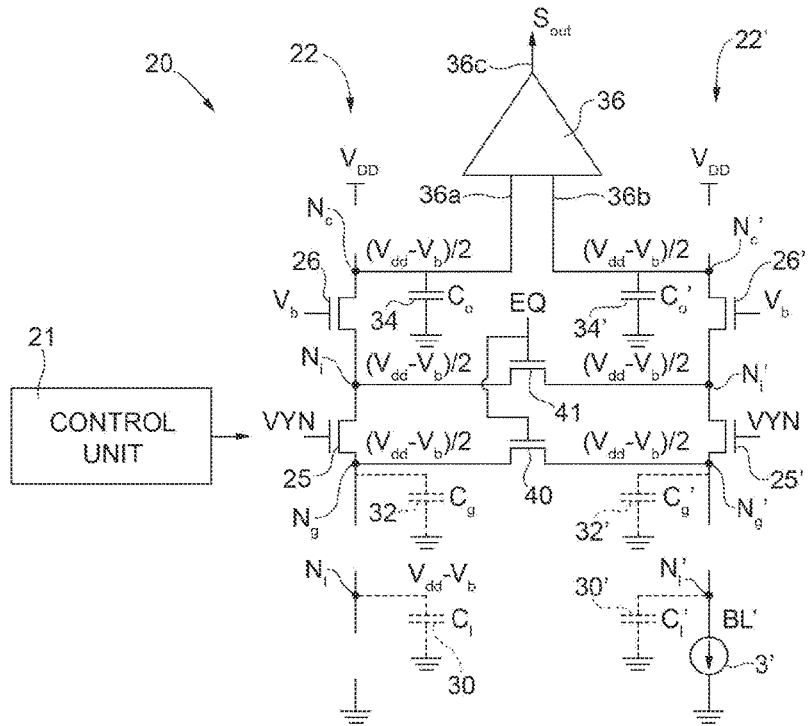

Then, during the second operating step, see FIG. 5, the operating conditions are modified as follows:

the local decoding signal VY0 is switched to the low value (local decoding transistor 23 is off);

the enabling signal EN is switched to the high value (enabling transistor 28 is off); and the equalization signal EQ is switched to the high value (coupling transistors 40, 41 are on).

Switching-on of the coupling transistors 40, 41 causes a process of equalization between the adjacent bitlines BL, BL', and of charge division between the corresponding parasitic capacitors 32, 32'.

In particular, the voltages on the global nodes $N_g$, $N_g'$ substantially reach a same value, $(V_{dd}-V_b)/2$, i.e., a value lower, as regards the circuit branch 22, than the value assumed during the previous, pre-charging, step.

Switching-off of the enabling transistors 28, 28' causes the voltages on the comparison nodes $N_c$, $N_c'$ to go to the same value of the internal nodes $N_i$, $N_i'$, which are in turn substantially equal to the aforesaid voltages on the global nodes $N_g$, $N_g'$.

Furthermore, the voltage on the local node $N_l$ of the circuit branch 22, associated to the memory cell 3 to be read, remains at the initial value $V_{dd}-V_b$ (due to switching-off of the local decoding transistor 23 and the floating condition of the same local node $N_l$).

The wordline WL associated to the memory cell 3 is in the meantime addressed and appropriately biased (in a per se known manner), by the control unit 21, in such a way that the cell reading current $I_{cell}$ flows in the memory cell 3, as a function of the datum stored. In particular, the row-biasing voltage $V_{WL}$ is supplied to the gate terminal of the memory cell.

The third operating step then follows, where two different operating conditions may arise according to whether the datum stored in the memory cell 3 to be read is a logic '1' or a logic '0'.

Figure 6A:
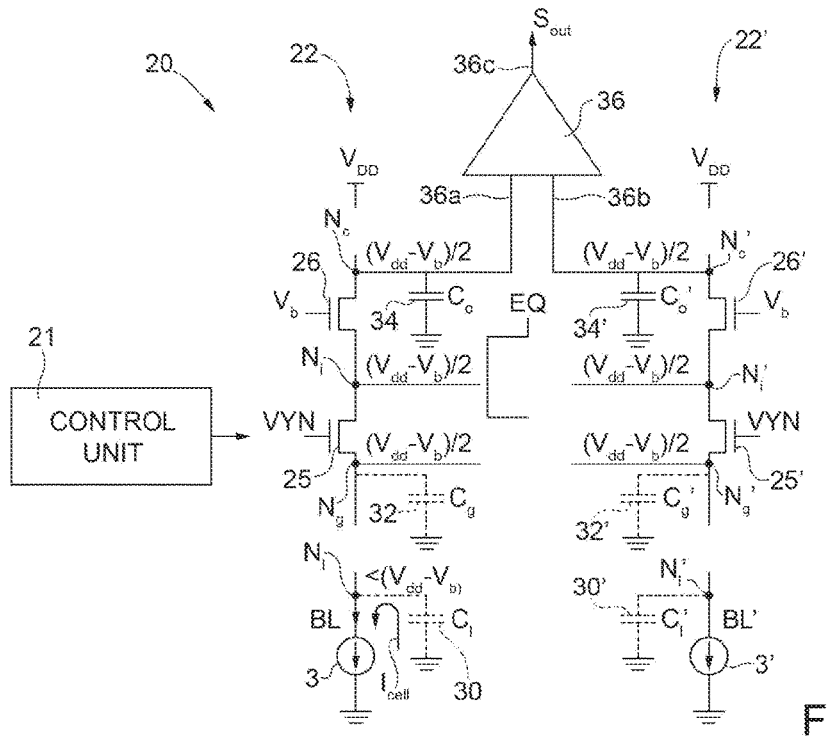

As shown in FIG. 6a, the equalization signal EQ again goes low, for turning off the coupling transistors 40, 41; the wordline WL has reached the correct biasing value.

In the case where the datum is a '1', the cell current $I_{cell}$ acquired from the memory cell 3 has discharged the local node $N_l$, bringing about a reduction of the voltage value thereof with respect to the value assumed in the previous step (i.e., $V_{dd}-V_b$), possibly reaching a zero value.

Figure 6B:
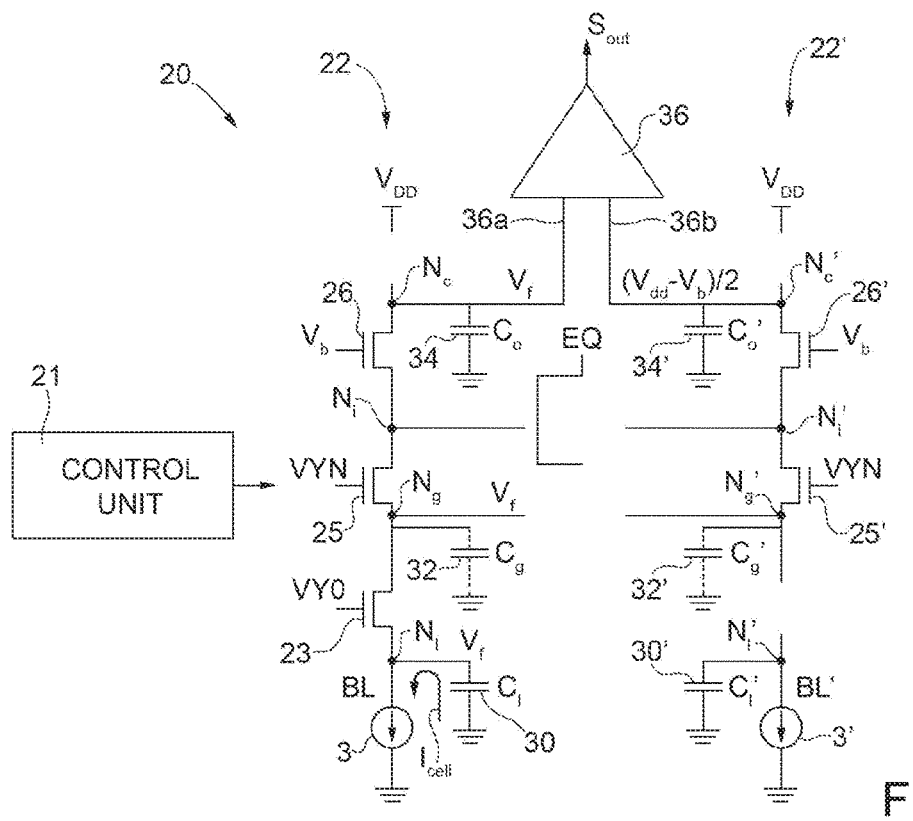

Then (FIG. 6b), the local decoding signal VY0 is switched again to the high value, by switching on the local decoding transistor 23, which thus connects the local node $N_l$ to the global node $N_g$.

The resulting charge division between the first and second parasitic capacitors 30, 32 leads to a consequent reduction of the voltage value on the global node $N_g$.

In detail, it is assumed that the relation $C_g = 10 \cdot C_l$ holds and that the cell current $I_{cell}$ is negligible in the calculation.

The sum of the amount of charge stored in the parasitic capacitors 30, 32 remains constant following capacitive division.

The relation $Q=C \cdot V$, which links the amount of charge, the capacitance, and the voltage of the parasitic capacitors 30, 32, is applied before and after the step of switching-on of the local decoding transistor 23.

In particular, the initial amount of charge (i.e., at the start of the aforesaid third step) stored in the first parasitic capacitor 30 is:

$$Q(C_l)_1 = C_l \cdot V(C_l)_1$$

where $V(C_l)_1$ is assumed equal to 0, on the hypothesis that the memory cell 3 has altogether discharged the capacitance of the first parasitic capacitor 30.

The initial amount of charge stored in the second parasitic capacitor 32 is instead given by $$Q(C_g)_1 = C_g \cdot V(C_g)_1$$

where $V(C_g)_1$ is equal to $(V_{dd}-V_b)/2$, on the basis of what has been discussed previously.

Furthermore, the final amount of charge (i.e., following upon the process of charge division due to switching-on of the local decoding transistor 23) stored in the first parasitic capacitor 30 is $$Q(C_l)_2 = C_l \cdot V(C_l)_2$$

where $V(C_l)_2$ is a final value $V_f$.

Likewise, the final amount of charge stored in the second parasitic capacitor 32 is $$Q(C_g)_2 = C_g \cdot V(C_g)_2$$

where $V(C_g)_2$ is equal to the same final value $V_f$, by virtue of the process of charge division.

By equaling the total sum of the initial and final amounts of charge, on the aforesaid hypothesis $C_g = 10 \cdot C_l$, we obtain $$Q(C_l)_1 + Q(C_g)_1 = Q(C_l)_2 + Q(C_g)_2$$

$$0 + 10 C_l \cdot (V_{dd}-V_b)/2 = C_l \cdot V_f + 10 C_l \cdot V_f$$

whence $$V_f = 5/11 \cdot (V_{dd}-V_b) = 0.45 \cdot (V_{dd}-V_b)$$

This final value $V_f$ is consequently lower than the initial voltage of the global node $N_g$, equal to $(V_{dd}-V_b)/2$.

It should be noted that, since the cell current $I_{cell}$ is non-negligible in the real case, the final value $V_f$ is generally still lower than the value indicated.

Figure 6C:
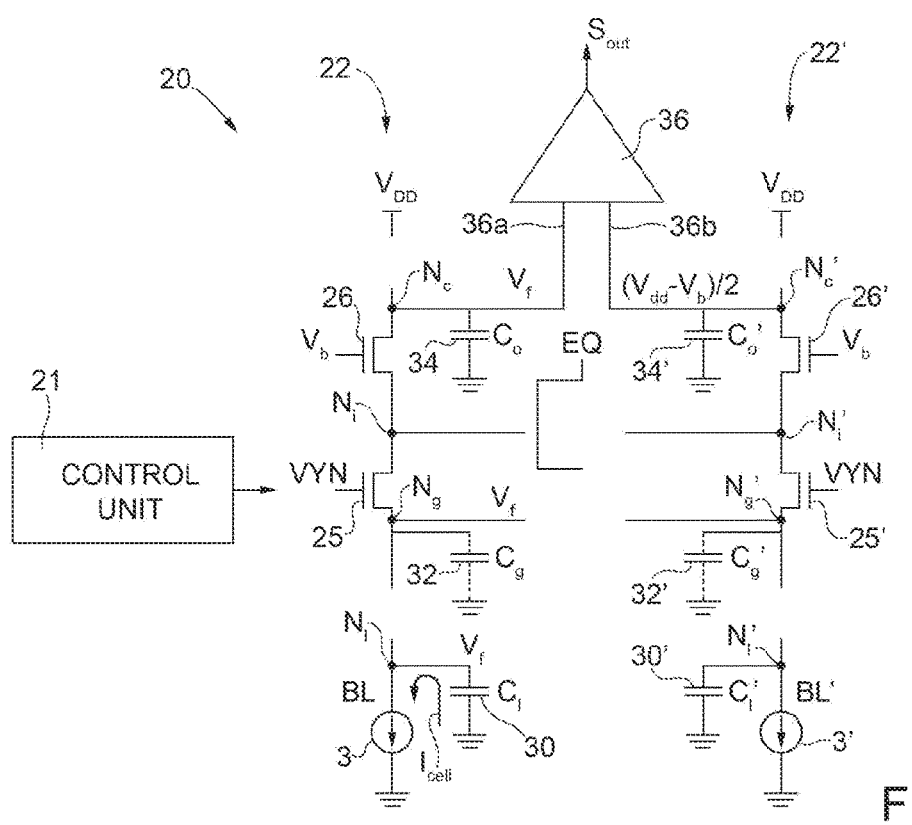

As shown in FIG. 6c, at the end of the third step, the local decoding signal VY0 is switched again to the low value, thus switching off the local decoding transistor 23, for "freezing" the values of the voltages on the local and global nodes $N_l$, $N_g$ (stored in the corresponding first and second parasitic capacitors 30, 32).

At this point, present on the first and second differential inputs 36a, 36b of the sense-amplifier stage 36 are two distinct voltage values, with the comparison voltage $V_c$ of the circuit branch 22 (which is substantially equal to the final value $V_f$) that is lower than the comparison voltage $V_c'$ of the circuit branch 22' (which has remained at the initial value equal to $(V_{dd}-V_b)/2$).

The digital output signal $S_{out}$ has in this case a first logic value, for example high, indicating reading of a logic '1' in the memory cell 3.

In general, the time allowed to the memory cell 3 during reading to discharge the local node $N_l$, in the case of cell at '1' has to be sufficient for providing a significant variation of voltage, or likewise a significant variation of charge so that in the subsequent capacitive division a significant reduction in the voltage of the global node $N_g$ and of the comparison node $N_c$ occurs, and a sufficient voltage difference is thus present that may be detected by the differential sense-amplifier structure.

There now follows a similar analysis of the case where the datum stored in the memory cell 3 is a logic '0'.

Figure 7A:
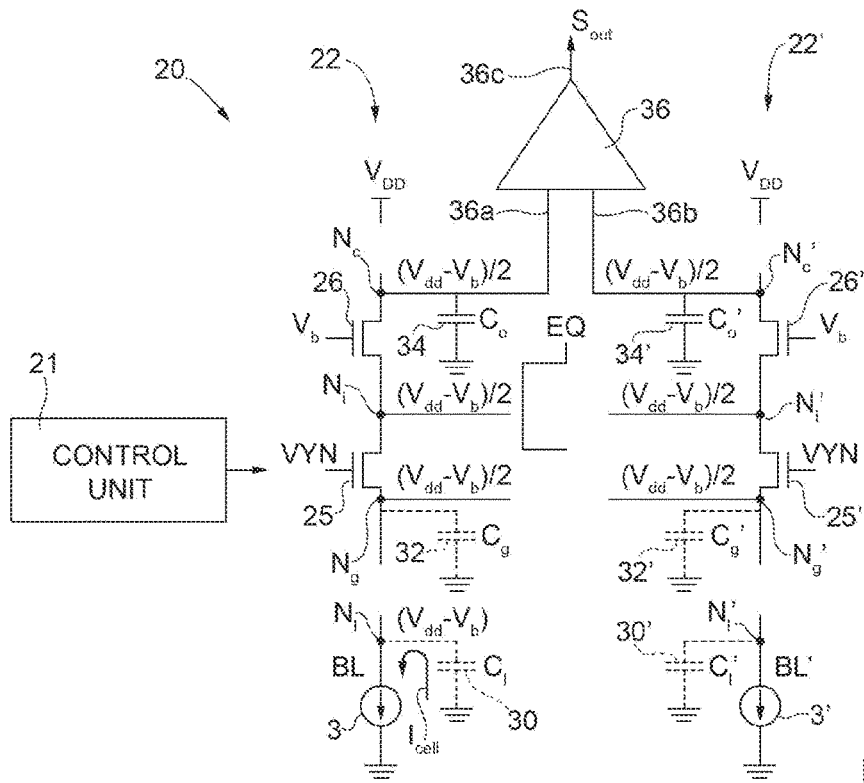

As shown in FIG. 7a (which, as the previous FIG. 6a, refers to start of the third reading step), since the datum is a '0', in this case there is no discharge current through the memory cell 3. Consequently, there does not takes place any discharge of the first parasitic capacitor 30 and any reduction of the voltage value of the local node $N_l$, which thus remains at the initial value $(V_{dd}-V_b)$.

Figure 7B:
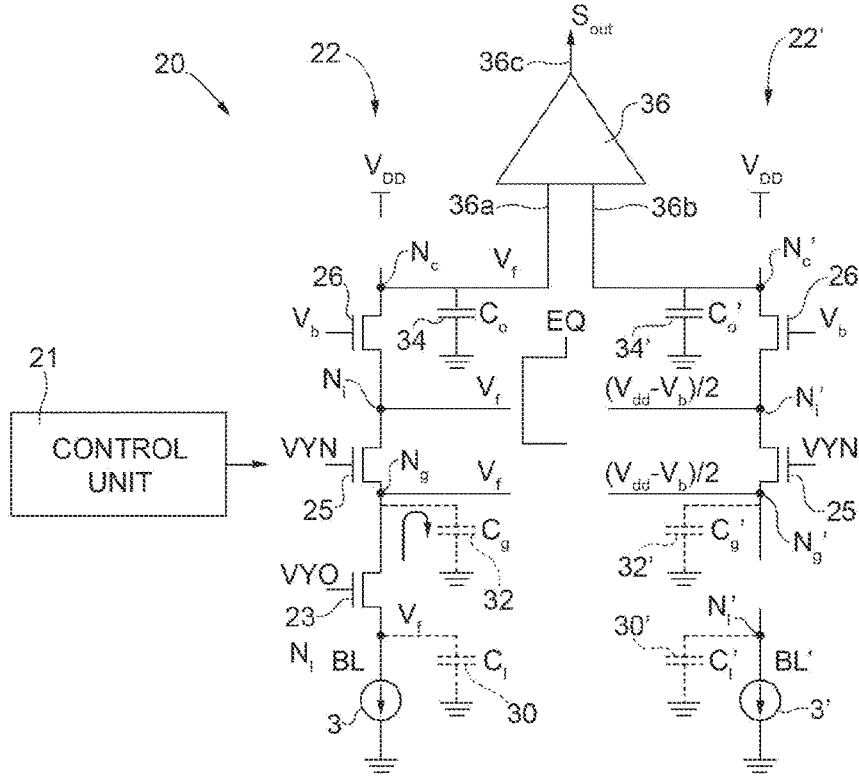

As shown in FIG. 7b, the local decoding signal VY0 is then switched to the high value, as described in regard to the previous case. However, in this case, the voltage value of the local node $N_l$ is higher than the voltage value of the global node $N_g$, which in fact initially is equal to $(V_{dd}-V_b)/2$.

The resulting charge division between the first and second parasitic capacitors 30, 32 thus leads to an increase in the value of the voltage on the same global node $N_g$.

In detail, assuming once again that the relation $C_g = 10 \cdot C_l$ applies, the initial amount of charge (i.e., at start of the aforesaid third step) stored in the first parasitic capacitor 30 is given by $$Q(C_l)_1 = C_l \cdot V(C_l)_1$$

where $V(C_l)_1$ is in this case equal to $V_{dd}-V_b$.

The initial amount of charge stored in the second parasitic capacitor 32 is given by $$Q(C_g)_1 = C_g \cdot V(C_g)_1$$

where $V(C_g)_1$ is equal to $(V_{dd}-V_b)/2$.

Furthermore, the final amount of charge (i.e., following upon the process of charge division due to switching-on of the local decoding transistor 23) stored in the first parasitic capacitor 30 is $$Q(C_l)_2 = C_l \cdot V(C_l)_2$$

where $V(C_l)_2$ is a final value $V_f$.

Likewise, the final amount of charge stored in the second parasitic capacitor 32 is $$Q(C_g)_2 = C_g \cdot V(C_g)_2$$

where $V(C_g)_2$ is equal to the final value $V_f$, by virtue of the process of charge division.

Equating the total sum of the initial and final amounts of charge, on the aforesaid hypothesis where $C_g = 10 \cdot C_l$, we obtain $$Q(C_l)_1 + Q(C_g)_1 = Q(C_l)_2 + Q(C_g)_2$$

$$C_l \cdot (V_{dd}-V_b) + 10 C_l \cdot (V_{dd}-V_b)/2 = C_l \cdot V_f + 10 C_l \cdot V_f$$

whence $$V_f = 6/11 \cdot (V_{dd}-V_b) = 0.54 \cdot (V_{dd}-V_b)$$

This final value $V_f$ is in this case consequently higher than the initial voltage on the global node $N_g$, equal to $(V_{dd}-V_b)/2$.

Figure 7C:
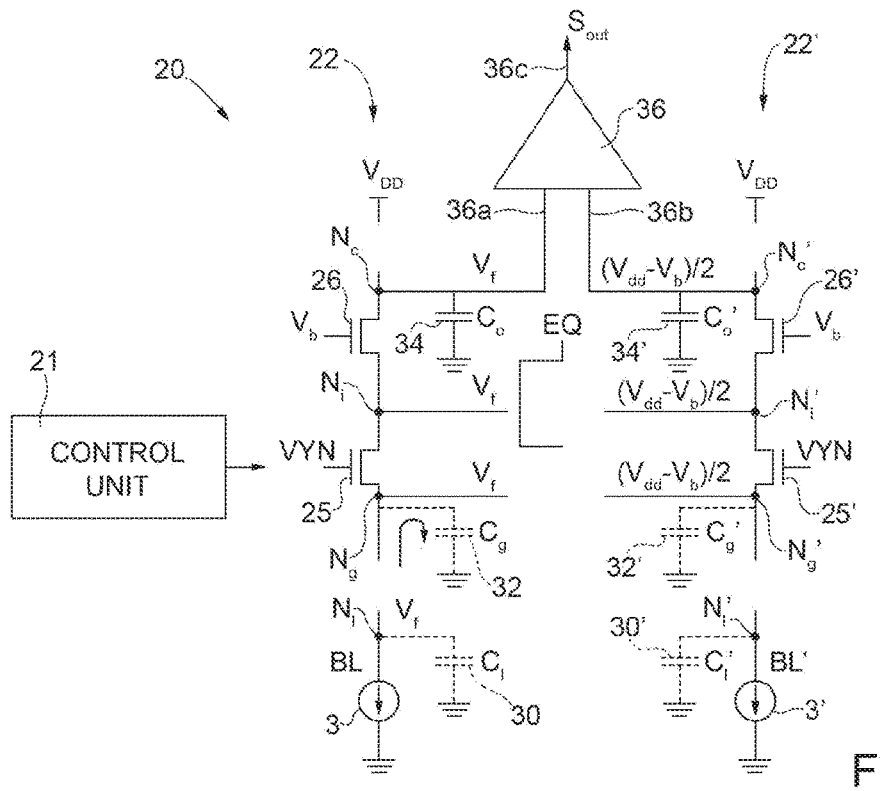

As shown in FIG. 7c, at the end of the third step, the local decoding signal VY0 is again switched to the low value, thus switching off the local decoding transistor 23 for "freezing" the values of the voltages on the local and global nodes $N_l$, $N_g$.

At this point, on the first and second differential inputs 36a, 36b of the sense-amplifier stage 36 two distinct voltage values are present, with the comparison voltage $V_c$ of the circuit branch 22 (substantially equal to the final value $V_f$) that is in this case higher than the comparison voltage $V_c'$ of the circuit branch 22' (which has remained at the initial value of $(V_{dd}-V_b)/2$).

The digital output signal $S_{out}$ consequently has in this case a second logic value, for example low, indicating reading of a logic '0' in the memory cell 3.

A description of some graphs that plot the evolution of the main control signals and of the main voltages on the nodes in the reading circuit 20, during the reading operation previously described in detail, is now presented.

Figure 8:
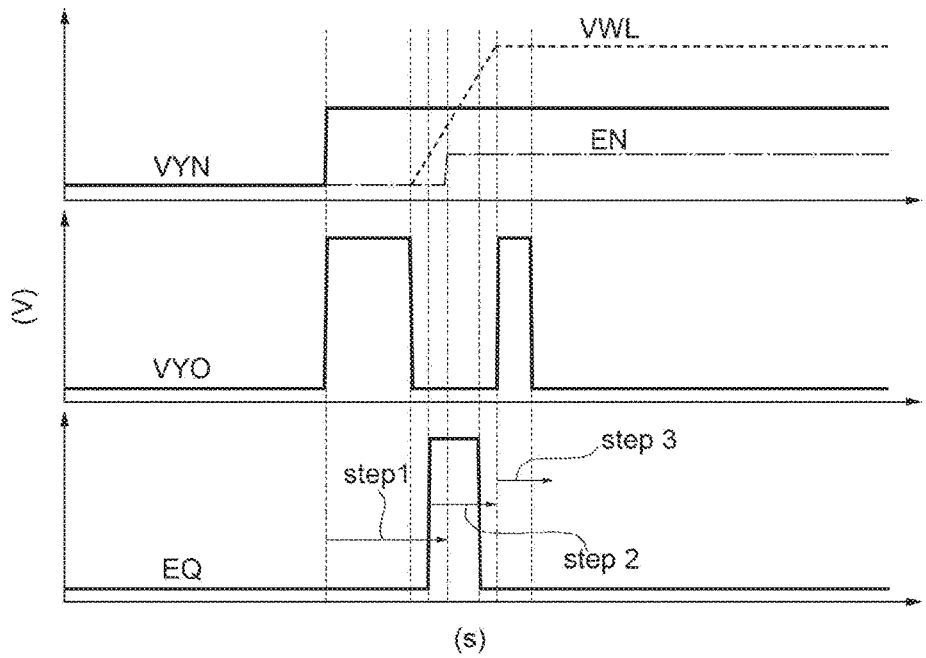
FIGS. 8, 9a-9b show plots of electrical quantities in the reading circuit of FIG. 3.

In particular, FIG. 8 shows, with reference to the operating steps described previously (referred to as "step 1", "step 2", and "step 3"), the waveforms of: the local decoding signals VY0, of the adjacent circuit branches 22, 22'; the row-biasing voltage $V_{WL}$ associated to the wordlines WL of the memory cell 3 activated for reading; the enabling signal EN; and the equalization signal EQ.

Figure 9A:
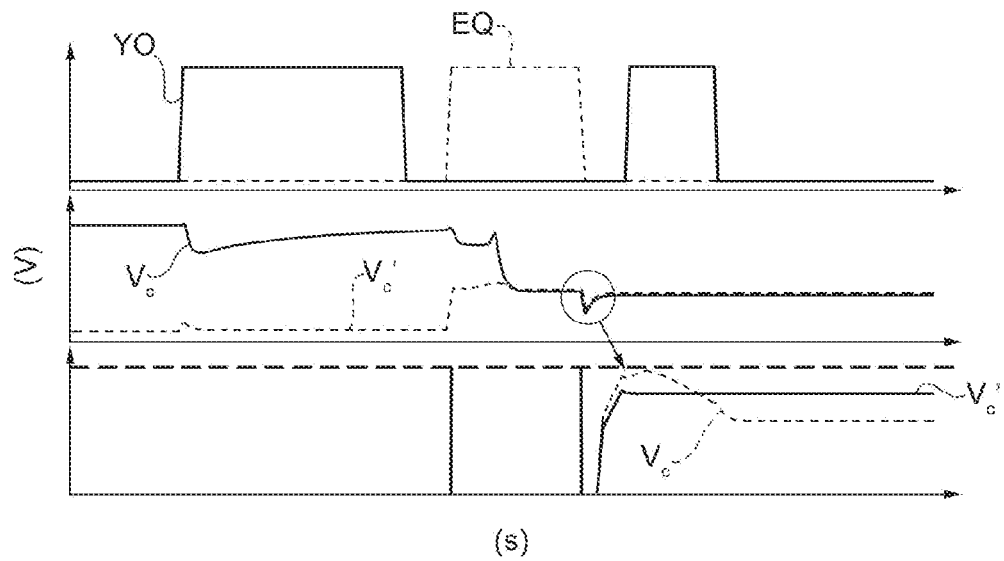

FIG. 9a shows the plots of the comparison voltages $V_c$, $V_c'$ of the adjacent circuit branches 22, 22' in the case of reading of a stored datum having value '1'. In particular, it is pointed out, in the enlarged plot illustrated in the bottom portion of FIG. 9a, how, during the last operating step, the comparison voltage $V_c$ drops below the comparison voltage $V_c'$, following upon charge division subsequent to discharging of the local node $N_l$ of the circuit branch 22 by the memory cell 3.

Figure 9B:
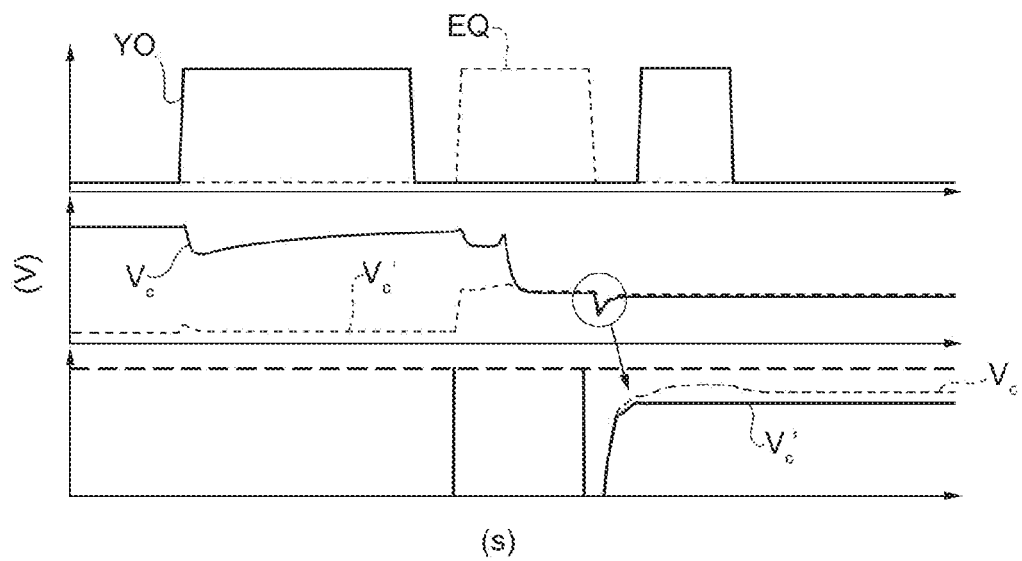

Likewise, FIG. 9b shows the plots of the comparison voltages $V_c$, $V_c'$ of the adjacent circuit branches 22, 22' in the case of reading of a stored datum having a value '0'; in particular, it is pointed out in this case that, following upon switching of the local decoding signal VY0 to the high state, in this case the local node $N_l$ is at a voltage value higher than the global node $N_g$ of the same circuit branch, with the final result that the comparison voltage $V_c$ is higher than the comparison voltage $V_c'$, following upon charge division.

In the embodiment illustrated, the present solution thus envisages exploitation of the hierarchical configuration of column decoding, provided with global and local decoding, which intrinsically offers two capacitances on which it is possible to implement the mechanism of charge division for detection of the datum stored. In particular, the parasitic capacitances $C_l$ and $C_g$ associated to the local and global bitlines $BL_l$, $BL_g$ are exploited, with the parasitic capacitance $C_l$ associated to the local bitline $BL_l$ that is lower (for example, by one order of magnitude) than the parasitic capacitance $C_g$ associated to the global bitline $BL_g$.

The present solution envisages exploitation of the aforesaid mechanism of charge division to cause, in the circuit branch 22, the capacitance $C_g$ associated to the global bitline $BL_g$, which determines the comparison voltage $V_c$ seen by the sense-amplifier stage 36, to be either discharged or charged by the capacitance $C_l$ of the local bitline $BL_l$, according to whether the datum stored in the memory cell 3 is a '1' or a '0'.

In particular, in the case where a '1' is read, the capacitance $C_l$ of the local bitline $BL_l$ discharges and, once connected to the global bitline $BL_g$, also the global bitline $BL_g$ discharges. Instead, in the case where a '0' is read, if the capacitance $C_l$ is at a voltage value higher than that of the capacitance $C_g$, it will be the capacitance $C_l$ that transfers charge onto the capacitance of the global bitline $BL_g$, leading to a rise in voltage.

Therefore: considering the initial voltage $V_{gi}$ at which the capacitance $C_g$ of the global bitline $Bl_g$ is found following upon the pre-charging step, the value of the voltage of the local bitline $B_l$ in the worst case of a stored datum equal to '0' ($V_{l_0}$), and the value of the voltage of the same local bitline $B_l$ in the worst case of a stored datum equal to '1' ($V_{l_1}$), the present solution envisages that the following relation will hold $$V_{l_1} < V_{gi} < V_{l_0}$$

In a per se known manner, the '0' and '1' logic values ideally represent, as regards '0' the total absence of current, such as not to move the drain node of the memory cell, i.e., an open circuit; and as regards '1', the dual condition, i.e., a short circuit such as to bring the drain of the memory cell to ground. The worst values are extreme values that may lead to confusion between the two logic values, thus, a cell at '0' that, however, absorbs a non-zero current or a cell at '1' that absorbs less current than what is expected, and generally have a value that depends upon the sensitivity of the reading circuit.

In particular, in the solution proposed, the operation of equalization between the bitlines BL, BL' advantageously enables exploitation of the bitline BL' adjacent to the one associated to the memory cell 3 activated for reading, which thus has substantially the same values of parasitic capacitance, acting on two structures that may be deemed identical for fixing the aforesaid initial voltage value $V_{gi}$.

During the reading operation, the comparison node $N_c'$ of the bitline BL' does not substantially modify its own voltage value with respect to the initial pre-charging value, whereas the comparison node $N_c$ of the bitline BL, thanks to the capacitive division, modifies its own voltage value, which becomes higher or lower according to the datum to be read.

The advantages of the solution proposed are clear from the foregoing description.

In any case, it is again emphasized that the solution does not envisage, for reading the datum stored, the use of any reference element or structure, in particular does not envisage the use of a memory reference cell or of a current derived therefrom, or of a reference-current generator.

Consequently, the resulting memory device 1 has smaller dimensions and lower electrical consumption as compared to traditional solutions.

The reading speed is further increased. In particular, via the solution described it is possible, for example, to read in a same step (i.e., during a same read operation) an entire half of the bitlines BL of the memory array 2, for example the odd ones, and, in the subsequent step, the other half of the bitlines BL, in the example all the even ones. In other words, the bitlines BL of a first half are thus, in one step, the ones read and, in the subsequent step, operate as comparison (i.e., as bitlines BL', according to what has been described previously) for reading the bitlines of the other half.

The solution described does not further envisage any substantial modifications to the architecture of the non-volatile memory device 1, apart from introduction of the coupling transistors 40, 41 between adjacent bitlines BL, BL', and an adequate generation of the control signals for the timing and management of the operating reading steps by the control unit 21.

Finally, it is clear that modifications and variations may be made to what has been described and illustrated herein, without thereby departing from the scope of the present invention, as defined in the annexed claims.

In this regard, it is emphasized that the solution described may be applied to different types of non-volatile memory devices (of an embedded or stand-alone type), for example EPROMs, EEPROMs, or PCMs (Phase-Change Memories), with single-level or multilevel memory cells, in which a comparison of current is required for reading the datum stored.

In general, for application of this solution the presence of two distinct nodes in the decoding column is sufficient (i.e., the nodes previously referred to as the local node $N_l$ and the global node $N_g$), associated to which are different values of capacitance, for implementation of the strategies of charge division described. In particular, in the case where one or both of the parasitic capacitances coupled to these nodes are not present, purposely provided charge-division capacitors may be inserted, electrically connected to the same nodes, in order to implement the solution described.

Furthermore, a different embodiment may envisage the presence of a single coupling transistor between the adjacent bitlines BL, BL', for example the coupling transistor 40 referred to previously (even though in general, the solution with two coupling transistors 40, 41 may offer a greater guarantee of proper operation and correct reading of the datum stored).

What is claimed is:

1. A reading circuit for reading a memory cell of a non-volatile memory device provided with a memory array with memory cells arranged in wordlines and bitlines, the bitlines including a first bitline associated with the memory cell to be read and a second bitline distinct from the first bitline, the reading circuit comprising:
    a first circuit branch associated with the first bitline, the first circuit branch having a first local node that is coupled to a first dividing capacitor, and a first global node that is coupled to a second dividing capacitor;
    a second circuit branch associated with the second bitline, the second circuit branch having a second local node that is coupled to a third dividing capacitor, and a second global node that is coupled to a fourth dividing capacitor;
    a decoder stage configured to selectively couple the first local node to the first bitline, to selectively couple the first global node to the first local node, to selectively couple the second local node to the second bitline, and to selectively couple the second global node to the second local node;
    a differential comparator stage having a first input selectively coupleable to the first global node, a second input selectively coupleable to the second global node, and an output configured to supply an output signal that has a value indicative of data stored in the memory cell;
    a coupling stage, configured to selectively couple the first global node and the second global node; and
    a control unit configured to control, during a reading operation, the decoder stage, the coupling stage, and the differential comparator stage for generation of the output signal, wherein the control unit is configured to control:
        a first operating step of pre-charging, in which the first and second global nodes and the first and second local nodes are pre-charged to a pre-charging voltage;
        a second operating step of equalization, in which the coupling stage couples the first global node to the second global node that the first global node and the second global node reach a common initial voltage; and
        a third operating step of reading of the data stored, in which: the first local node is coupled to the first bitline and to the memory cell, activated for reading, so that a respective voltage value discharges, or does not discharge, as a function of the data stored; then, the first local node is coupled to the first global node to generate a charge division between the first and second dividing capacitors, following upon which the voltage value of the global node goes to a value higher, or lower, than the initial value, as a function of the data stored; and then, the differential comparator stage generates the output signal, based on a comparison between a first comparison voltage that is a function of the voltage of the first global node and a second comparison voltage that is a function of the voltage of the second global node.

2. The circuit according to claim 1, wherein the control unit is configured to determine a duration of time in which the first local node is coupled to the first bitline and to the memory cell activated for reading, so that the voltage of the first local node, following upon the coupling, goes to a first value, lower than the initial voltage when the data stored is a logic '1', and goes to a second value, higher than the initial voltage when the data stored is a logic '0'.

3. The circuit according to claim 1, further comprising a column-decoder stage comprising:
    a first local decoding transistor having a first conduction terminal connected to the first local node, a second conduction terminal connected to the first global node, and a control terminal coupled to receive a first local decoding signal from the control unit;
    a first global decoding transistor, having a first conduction terminal connected to the first global node, a second conduction terminal connected to a first internal node, and a control terminal coupled to receive a first global decoding signal from the control unit;
    a second local decoding transistor having a first conduction terminal connected to the second local node, a second conduction terminal connected to the second global node, and a control terminal coupled to receive a second local decoding signal from the control unit; and
    a second global decoding transistor, having a first conduction terminal connected to the second global node, a second conduction terminal connected to a second internal node, and a control terminal coupled to receive a second global decoding signal from the control unit;
    wherein the first internal node is selectively coupleable to the first input of the differential comparator stage, and the second internal node is selectively coupleable to the second input of the differential comparator stage.

4. The circuit according to claim 3, wherein the coupling stage comprises a first coupling transistor connected between the first and second global nodes and having a control terminal coupled to receive an equalization signal from the control unit.

5. The circuit according to claim 4, wherein the coupling stage further comprises a second coupling transistor connected between the first and second internal nodes and having a control terminal coupled to receive the equalization signal.

6. The circuit according to claim 1, wherein the first and second bitlines are adjacent in the memory array, have substantially equivalent values of capacitance for the first dividing capacitor and third dividing capacitor, and have substantially equivalent values of capacitance for the second dividing capacitor and the fourth dividing capacitor.

7. The circuit according to claim 1, wherein the first and second dividing capacitors are parasitic capacitors associated with the first bitline and where in the third and fourth dividing capacitors are parasitic capacitors associated with the second bitline.

8. The circuit according to claim 1, wherein a value of capacitance of the second dividing capacitor is higher than a value of capacitance of the first dividing capacitor.

9. The circuit according to claim 1, wherein the first bitline and the second bitline are complementary bitlines.

10. A non-volatile memory device, comprising:
    a memory array with memory cells arranged in wordlines and bitlines; and
    the reading circuit according to claim 1, the reading circuit being coupled to the memory array and designed to implement an operation of reading of the data stored in the memory cells of the memory array.

11. The memory device according to claim 10, wherein the memory cells comprise flash memory cells.

12. A memory device comprising:
an array of non-volatile memory cells arranged in wordlines and bitlines, the bitlines including a bitline and a complementary bitline;
a first local decoding transistor having a current path coupled between the bitline and a first global node;
a first global decoding transistor having a current path coupled between the first global node and a first internal node;
a second local decoding transistor having a current path coupled between the complementary bitline and a second global node;
a second global decoding transistor having a current path coupled between the second global node and a second internal node;
a differential comparator stage having a first input and a second input;
a first protection transistor with a current path coupled between the first internal node and the first input of the differential comparator stage;
a second protection transistor with a current path coupled between the second internal node and the second input of the differential comparator stage;
a first equalization transistor coupled between the first global node and the second global node; and
a control unit coupled to control terminals of the first local decoding transistor, the first global decoding transistor, the second local decoding transistor, and the second global decoding transistor, wherein the first local decoding transistor is coupled to the bitline at a first local node, wherein the second local decoding transistor is coupled to the complementary bitline at a second local node, and wherein the control unit is configured to control:
a first operating step of pre-charging, in which the first and second global nodes and the first and second local nodes are pre-charged to a pre-charging voltage;
a second operating step of equalization, in which the first global node is coupled to the second global node so that the first global node and the second global node reach a common initial voltage; and
a third operating step of reading of a datum stored, in which: the first local node is coupled to a memory cell of the bitline so that a respective voltage value discharges or does not discharge as a function of a datum stored in the memory cell; then, the first local node is coupled to the first global node to generate a charge division between the first and second dividing capacitors, following upon which the voltage value of the first global node goes to a value that is higher or lower than the initial value as a function of the datum stored in the memory cell; and then, the differential comparator stage generates an output signal based on a comparison between a first comparison voltage that is a function of the voltage of the first global node and a second comparison voltage that is a function of the voltage of the second global node.

13. The memory device of claim 12, further comprising a first dividing capacitor coupled between bitline and the first local decoding transistor, a second dividing capacitor coupled to the first global node, a third dividing capacitor coupled between the complementary bitline and the second local decoding transistor, and a fourth dividing capacitor coupled to the second global node.

14. The memory device of claim 13, wherein the first, second, third, and fourth dividing capacitors are parasitic capacitors.

15. The memory device of claim 13, wherein a value of capacitance of the second dividing capacitor is higher than a value of capacitance of the first dividing capacitor and wherein a value of capacitance of the fourth dividing capacitor is higher than a value of capacitance of the third dividing capacitor.

16. The memory device of claim 15, wherein the value of capacitance of the second dividing capacitor is equal to the value of capacitance of the fourth dividing capacitor, and wherein the value of capacitance of the first dividing capacitor is equal to the value of capacitance of the third dividing capacitor.

17. The memory device of claim 12, wherein the array of non-volatile memory cells comprises flash memory cells.

18. The memory device of claim 12, wherein the control unit is configured to determine a duration of time in which the first local node is coupled to the bitline and to the memory cell activated for reading, so that the voltage of the first local node, following upon the coupling, goes to a first value, lower than the initial voltage when the data stored is a logic '1', and goes to a second value, higher than the initial voltage when the data stored is a logic '0'.

* * * * *